(12) United States Patent
Kim

(10) Patent No.: US 7,037,821 B2
(45) Date of Patent: May 2, 2006

(54) METHOD FOR FORMING CONTACT OF SEMICONDUCTOR DEVICE

(75) Inventor: Hyung Hwan Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 11 days.

(21) Appl. No.: 10/879,306

(22) Filed: Jun. 30, 2004

(65) Prior Publication Data

US 2005/0090054 A1    Apr. 28, 2005

(30) Foreign Application Priority Data

Oct. 22, 2003    (KR) .................. 10-2003-0073857

(51) Int. Cl.
*H01L 21/4763* (2006.01)

(52) U.S. Cl. ................................................ 438/622

(58) Field of Classification Search ............ 438/622, 438/631, 645, 551, 366, 230, 692, 745, 756, 438/618, 597; 257/79

See application file for complete search history.

(56) References Cited

U.S. PATENT DOCUMENTS 5,953,609 A * 9/1999 Koyama et al. ........... 438/253
6,303,506 B1 * 10/2001 Nojo et al. ............... 438/692
6,521,934 B1 * 2/2003 Yasuda ..................... 257/296
6,660,573 B1 * 12/2003 Han ........................ 438/149

OTHER PUBLICATIONS

S.Wolf et al., "Silicon Processing For VLSI Era", vol. 1, pp. 399, 340, 1986.*

* cited by examiner

*Primary Examiner*—Carl Whitehead, Jr.
*Assistant Examiner*—Monica D. Harrison
(74) *Attorney, Agent, or Firm*—Heller Ehrman LLP

(57) ABSTRACT

A method for forming a contact of a semiconductor deices is disclosed. More specifically, in the method for forming a contact of a semiconductor device, an interlayer dielectric (hereinafter, referred to as "ILD") layer is polished using a CMP slurry having high selectivity to an oxide film in a STI (shallow trench isolation) etching process for forming a line-type storage node contact (hereinafter, referred to as "SNC", and an ILD layer having a predetermined thickness is re-formed on the semiconductor substrate to secure a sufficient etching margin to a subsequent etching process, thereby preventing loss of a hard mask nitride film of a bit line and reducing fail of a self-aligned contact (hereinafter, referred to as "SAC") between a storage node and a bit line.

16 Claims, 8 Drawing Sheets

METHOD FOR FORMING CONTACT OF SEMICONDUCTOR DEVICE

BACKGROUND OF THE INVENTION

1. Field of the Invention

The present invention generally relates to a method for forming a contact of a semiconductor device, and more specifically, to a method for forming a contact of a semiconductor device wherein an interlayer dielectric (hereinafter, referred to as "ILD") layer is polished using a CMP slurry having high selectivity to an oxide film in a STI (shallow trench isolation) etching process for forming a line-type storage node contact (hereinafter, referred to as "SNC"), and an ILD layer having a predetermined thickness is re-formed on the semiconductor substrate to secure a sufficient etching margin to a subsequent etching process, thereby preventing loss of a hard mask nitride film of a bit line and reducing fail of a self-aligned contact (hereinafter, referred to as "SAC") between a storage node and a bit line.

2. Description of the Prior Art

The development of fine pattern formation technology has affected the high-integration trend of semiconductor devices, and the size of a unit cell of a semiconductor memory device has been reduced depending on high integration and high capacity of the semiconductor memory device.

Specifically, in case of DRAM (Dynamic Random Access Memory) which leads increase of integration degree, vertical structures become complicated according to reduction of memory cell size. As a result, in order to increase the effective area of a capacitor, a capacitor is formed after a bit line is formed.

In addition, when the bit line is formed, it is important to form a SNC for performing an electrical operation between a transistor and a capacitor.

The SNC is formed by a line-type SAC process. In the line-type SAC process, a bit line is patterned, an ILD layer is formed, and the semiconductor substrate is etched except a part of the ILD layer for separating a contact.

Here, in order to secure an etching margin for the etching process, the ILD layer having a predetermined thickness is required to remain on the bit line in the planarization process on the ILD layer. However, as a semiconductor device becomes microscopic, it is difficult to perform the planarization process on the ILD layer on the bit line, thereby forming the ILD layer of non-uniformity.

FIGS. 1a to 1f are diagrams illustrating a conventional method for forming a contact of a semiconductor device.

Referring to FIG. 1a, a first ILD layer 5 using an oxide film is formed on a semiconductor substrate 1 having a cell transistor (not shown) and a lower poly silicone plug 3.

As shown in FIG. 1b, the stacked structure of a barrier layer (not shown) material for bit line, a conductive layer (not shown) for bit line and a hard mask nitride film (not shown) are formed on the first ILD layer 5 of FIG. 1a, and a selectively etching is performed the stacked structure to form a bit line 13 comprising a barrier layer pattern 7 for bit line, a conductive layer pattern 9 for bit line and a hard mask nitride film pattern 11.

As shown in FIG. 1c, a bit line spacer 15 is formed at a sidewall of the bit line 13 of FIG. 1b.

As shown in FIG. 1d, a second ILD layer 17 is formed on the semiconductor substrate including bit line of FIG. 1c.

The second ILD layer 17 of FIG. 1d is polished using common CMP slurry. Due to the polishing process, an ILD layer having a predetermined thickness remains on the bit line 13.

The common CMP slurry including a colloidal or fumed $SiO_2$ abrasive and additive such as $KOH/NH_4OH$ has a pH ranging from 10 to 11 and a polishing selectivity in the range of 1:4 for a nitride film: oxide film.

As shown in FIG. 1f, a SNC etching process is performed on the planarized second ILD layer 17 shown in FIG. 1e until the poly silicone plug 3 is exposed to form a SNC opening 19.

When the ILD layer is polished using the common slurry so that the ILD layer having a predetermined thickness remains on the bit line, the ILD layer on the bit line has large difference in the thickness, thereby causing loss of the hard mask nitride film in a subsequent SNC etching process.

For example, if an etching process is performed after an etching target for forming a SNC opening is determined in the ILD layer having a thick thickness formed on the bit line, the hard mask nitride 11 is severely lost on the ILD layer 17 having a thick thickness as shown in FIG. 2a. In this way, since the thickness of the hard mask nitride film becomes thinner by a SNC CMP process, errors of the bit line and SAC are generated in the etching process for forming a subsequent SN.

On the other hand, if an etching process is performed after an etching target is determined in the ILD layer having a thin thickness formed on the bit line, the upper portion of the ILD layer 17 having a thin thickness is not polished but remains on the bit line as shown in FIG. 2b. As a result, the SNC is not open.

This shortcoming generates between area difference of the SNC region and size difference of the bottom region in the etching process. As a result, it is difficult to embody uniform device characteristics on the whole surface of the wafer.

SUMMARY OF THE INVENTION

It is an object of the present invention to provide a method for forming a contact of a semiconductor device wherein an ILD layer is polished using a CMP slurry having more excellent polishing selectivity to an oxide film than to an nitride film and an ILD layer having a predetermined thickness is re-deposited to form the uniform ILD layer on a bit line, thereby securing a sufficient etching margin for performing a subsequent SNC etching process.

In an embodiment, a method for forming a contact of a semiconductor device comprises the steps of:

forming a first interlayer dielectric (ILD) layer on a semiconductor substrate having a cell transistor and a lower poly silicon plug thereon;

forming a first interlayer dielectric (ILD) layer on a semiconductor substrate having a cell transistor and a lower poly silicon plug thereon forming a stacked structure of a barrier layer, a conductive layer and a hard mask nitride film on the first ILD layer, and selectively etching the stacked structure to form a bit line forming a second ILD layer on the semiconductor substrate including the bit line polishing the second ILD layer using CMP slurry having high selectivity for oxide film to expose the hard mask nitride film forming a third ILD layer on the exposed hard mask nitride film and the second ILD layer, and performing an etching process to form an opening for storage node contact exposing the lower poly silicon plug.

DETAILED DESCRIPTION OF THE PREFERRED EMBODIMENTS

The present invention will be described in detail with reference to the accompanying drawings.

Figure 1A:
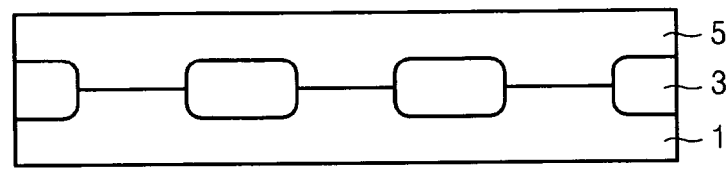
FIGS. 1a to 1f are diagrams illustrating a conventional method for forming a contact of a semiconductor device.
Figure 1B:
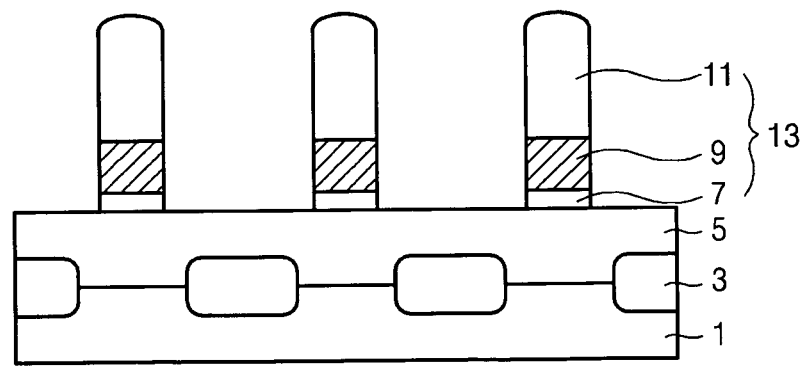
Figure 1C:
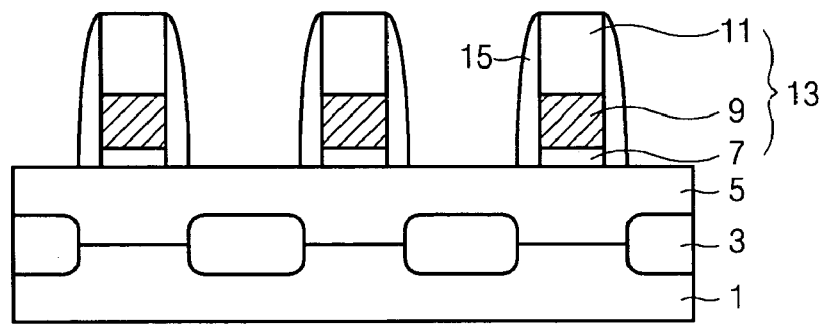
Figure 1D:
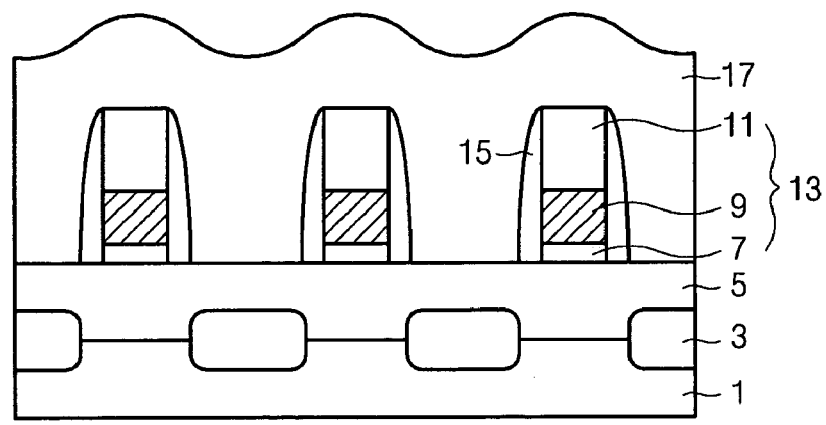
Figure 1E:
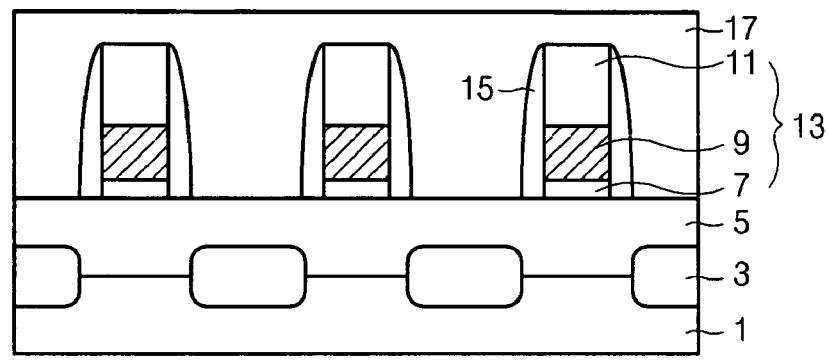
Figure 1F:
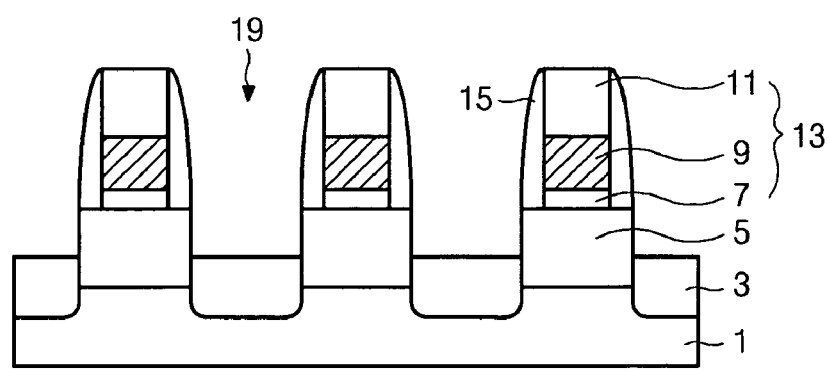
Figure 2A:
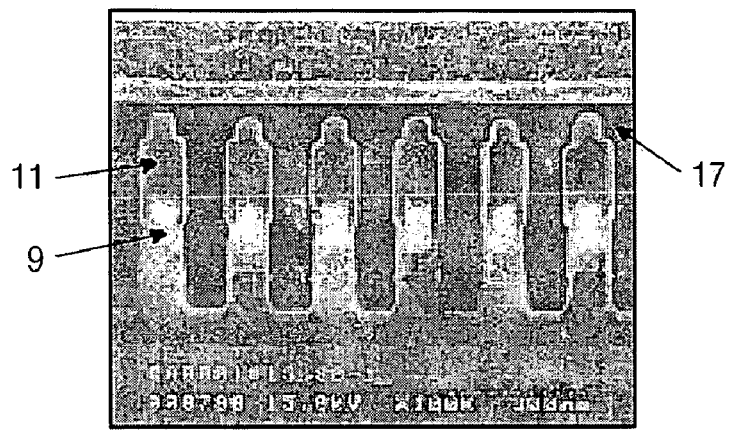
FIGS 2a and 2b are cross-sectional diagrams illustrating a thickness of an ILD layer on a bit line formed according to the conventional method.
Figure 2B:
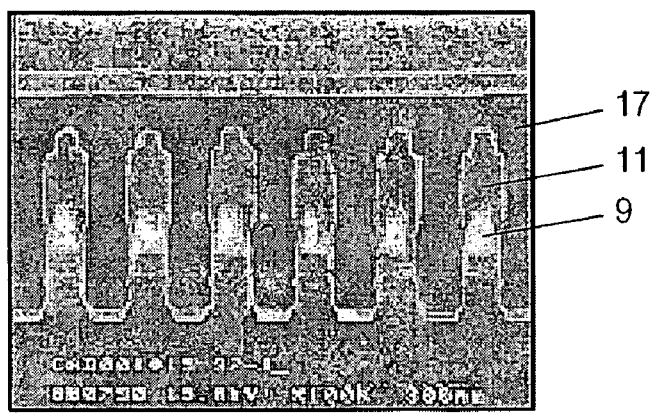
Figure 3A:
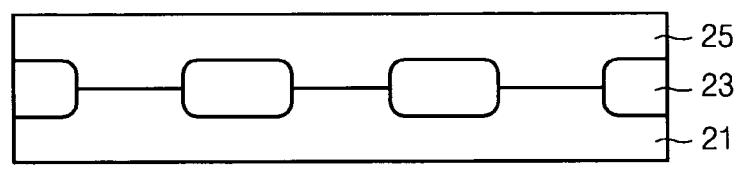
FIGS. 3a to 3g are diagrams illustrating a method for forming a contact of a semiconductor device according to an embodiment of the present invention.

Referring to FIG. 3a, a first ILD layer 25 is formed by depositing an oxide film on the semiconductor substrate 21 having a cell transistor (not shown) and a lower poly silicone plug 23.

Figure 3B:
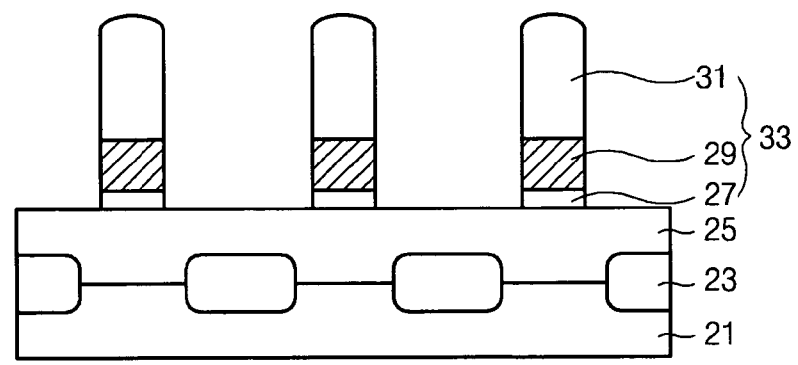

As shown in FIG. 3b, the stacked structure of a barrier layer (not shown) material for bit line, a conductive layer (not shown) for bit line and a hard mask nitride film (not shown) are formed on the first ILD layer 25 of FIG. 3a, and a selective etching is subjected to the stacked structure to form a bit line 33 comprising a barrier layer pattern 27 for bit line, a conductive layer pattern 29 for bit line and a hard mask nitride film pattern 31.

The barrier layer material for bit line is formed of Ti/TiN, and the conductive layer is tungsten.

Figure 3C:
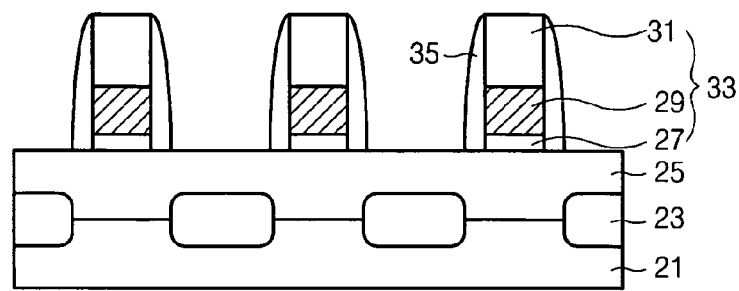

As shown in FIG. 3c, a bit line spacer 35 is formed at a sidewall of the bit line 33 of FIG. 3b.

Figure 3D:
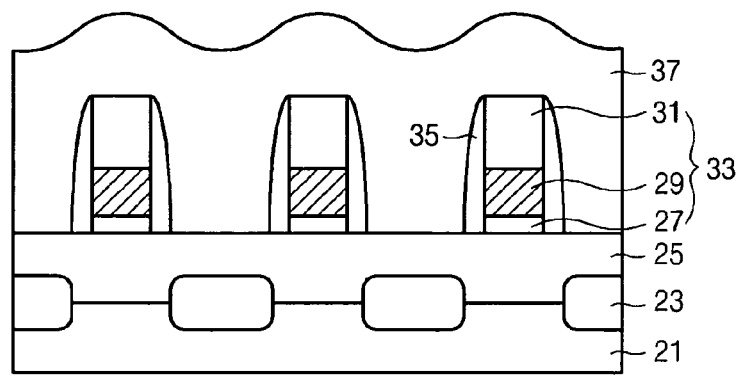

As shown in FIG. 3d, a second ILD layer 37 is formed on the entire surface of the semiconductor substrate of FIG. 3c. Here, the first ILD layer and the second ILD layer are preferably formed using a common oxide film.

Figure 3E:
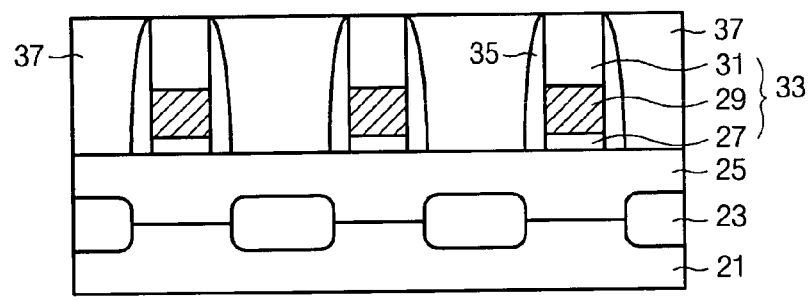

As shown in FIG. 3e, a CMP process is performed on the second ILD layer 37 of FIG. 3d by using CMP slurry having selectivity for oxide film to expose the hard mask nitride film 31 as a polishing barrier film.

The CMP slurry for oxide film, CMP slurry composition for a STI process, comprises Ceria (CeO2) as an abrasive and has a pH ranging from 4 to 10, preferably from 6 to 8. Distilled water or ultra-pure water is used as the solvent.

Also, the CMP slurry for oxide film comprises an organic polymer as an additive which is preferably polyacrylic acid salt.

An amount of the abrasive ranges from 0.5 to 10 wt %, preferably from 1 to 5 wt %, and an amount of the additive ranges from 0.5 to 10 wt %, preferably from 1 to 5 wt %.

The selectivity ratio of slurry composition for a nitride film to oxide film according to an embodiment of the present invention ranges 1:10~200, preferably 1:30~200.

The second ILD layer 37 is polished using CMP slurry for oxide film having high selectivity ratio of 1:10~200 for a nitride film to oxide film to exposed the hard mask nitride film.

Figure 3F:
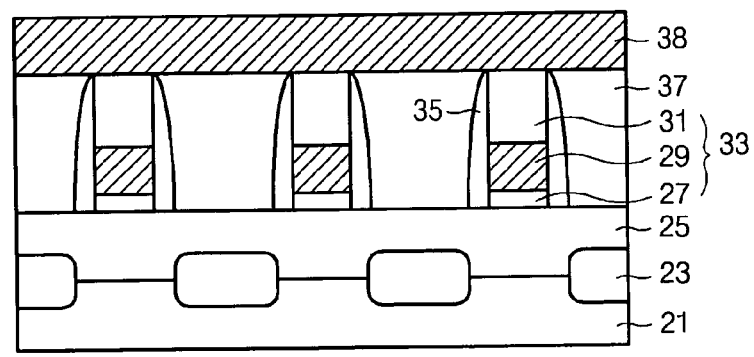

As shown in FIG. 3f, a third ILD layer 38 is uniformly formed on the exposed hard mask nitride film and the second ILD layer 37 planarized by the polishing process of FIG. 3e.

Here, the third ILD layer 38 is formed from a source selected from a group consisting of HDP PSG (high density plasma phosphosilicate glass), BPSG (borophosphosilicate glass), PSG (phosphosilicate glass), HDP USG (high density plasma undoped silicate glass), FSG (fluorosilicate glass), PE-$SiH_4$ (plasma enhanced-silane), LP-TEOS (low pressure-tetraethoxysilicate glass) and PE-TEOS (plasma enhanced-tetraethoxysilicate glass).

Here, a thickness of the third ILD layer ranges from 500 to 5000 Å, preferably from 500 to 2000 Å.

Figure 3G:
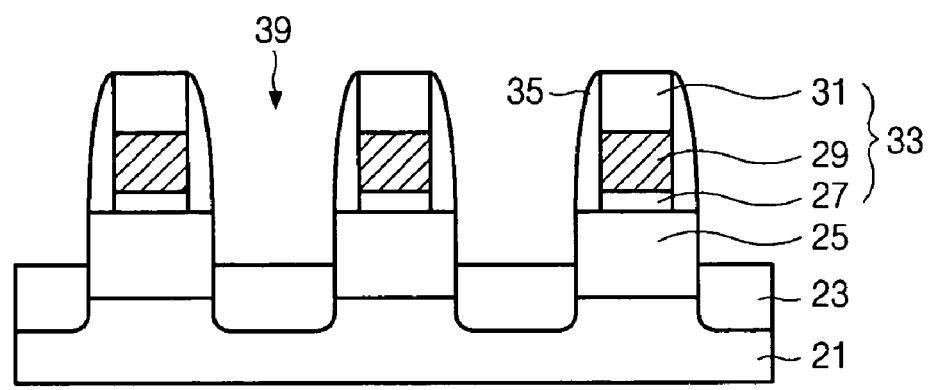

The SNC etching process is subjected to the third ILD layer 38 and the second ILD layer 37 of FIG. 3f to form an opening 39 for the SNC exposing the lower poly silicone plug shown in FIG. 3g.

In this way, after the hard mask nitride film is exposed and the third ILD layer having a predetermined thickness is re-deposited on the hard mask nitride film, the ILD layer having the uniform thickness can be formed on the bit line. As a result, loss of the hard mask nitride film can be prevented in a subsequent etching process for forming the SNC, thereby securing a sufficient etching margin and reducing errors between the SN and the bit line.

As discussed earlier, in an embodiment of the present invention, after a second ILD layer is polished, a third ILD layer having a predetermined thickness is formed on the second ILD layer. As a result, loss of a bit line hard mask nitride film can be prevented in a subsequent etching process for forming a SNC, thereby a sufficient etching margin and reducing errors between the SN and the bit line. Accordingly, stable devices can be manufactured.

What is claimed is:

1. A method for forming a contact of a semiconductor device, comprising the steps of:
    forming a first interlayer dielectric (ILD) layer on a semiconductor substrate having a cell transistor and a lower poly silicon plug thereon;
    forming a stacked structure of a barrier layer, a conductive layer and a hard mask nitride film on the first ILD layer, and selectively etching the stacked structure to form a bit line;
    forming an oxide film spacer at a sidewall of the bit line;
    forming a second ILD layer on the semiconductor substrate including the bit line;
    polishing the second ILD layer using CMP slurry having high selectivity for oxide film to expose the hard mask nitride film;
    forming a third ILD layer on the exposed hard mask nitride film and the second ILD layer; and
    performing an etching process to form an opening for storage node contact exposing the lower poly silicon plug.

2. The method according to claim 1, wherein the CMP slurry has a pH ranging from 4 to 10.

3. The method according to claim 1, wherein the CMP slurry has a pH ranging from 6 to 8.

4. The method according to claim 1, wherein the CMP slurry comprises distilled water or ultra-pure water as a solvent.

5. The method according to claim 1, wherein the CMP slurry comprises Ceria ($CeO_2$) as an abrasive.

6. The method according to claim 5, wherein an amount of the abrasive ranges from 0.5 to 10 wt % of the CMP slurry.

7. The method according to claim 1, wherein the CMP slurry comprises an organic polymer as an additive.

8. The method according to claim 7, wherein the organic polymer is a polyacrylic acid salt.

9. The method according to claim 7, wherein an amount of the additive ranges from 0.5 to 10 wt % of the CMP slurry.

10. The method according to claim 1, wherein the selectivity ratio of the CMP slurry for nitride film to oxide film ranges of 1:10~200.

11. The method according to claim 1, wherein the selectivity ratio of the CMP slurry for nitride film to oxide film ranges of 1:30~200.

12. The method according to claim 1, wherein the barrier layer comprises Ti/TiN.

13. The method according to claim 1, wherein the conductive layer comprises tungsten.

14. The method according to claim 1, wherein the third ILD layer is formed from a source selected from a group consisting of HDP PSG (high density plasma phosphosilicate glass), BPSG (borophosphosilicate glass), PSG (phosphosilicate glass), HDP USG (high density plasma undoped silicate glass), FSG (fluorosilicate glass), PE-SiH$_4$ (plasma enhanced-silane), LP-TEOS (low pressure-tetraethoxysilicate glass) and PE-TEOS (plasma enhanced-tetraethoxysilicate glass).

15. The method according to claim 1, wherein a thickness of the third ILD layer ranges from 500 to 5000 Å.

16. The method according to claim 1, wherein a thickness of the third ILD layer ranges from 500 to 2000 Å.

* * * * *